(12) United States Patent
Leitgeb et al.

(10) Patent No.: US 11,201,119 B2
(45) Date of Patent: Dec. 14, 2021

(54) RF FUNCTIONALITY AND ELECTROMAGNETIC RADIATION SHIELDING IN A COMPONENT CARRIER

(71) Applicant: AT & S Austria Technologie & Systemtechnik Aktiengesellschaft, Leoben (AT)

(72) Inventors: Markus Leitgeb, Trofaiach (AT); Martin Schrems, Eggersdorf (AT); Erich Schlaffer, St. Lorenzen (AT); Steve Anderson, Gilbert, AZ (US)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 523 days.

(21) Appl. No.: 16/001,831

(22) Filed: Jun. 6, 2018

(65) Prior Publication Data
US 2019/0378801 A1   Dec. 12, 2019

(51) Int. Cl.
| H01L 23/552 | (2006.01) |
| H01L 23/522 | (2006.01) |
| H01L 23/00 | (2006.01) |

(52) U.S. Cl.
CPC ........ *H01L 23/552* (2013.01); *H01L 23/5226* (2013.01); *H01L 24/18* (2013.01); *H01L 2223/6677* (2013.01)

(58) Field of Classification Search
CPC .... H01L 23/552; H01L 23/5226; H01L 24/18
See application file for complete search history.

(56) References Cited

U.S. PATENT DOCUMENTS

| 5,127,486 A | 7/1992 | Petersen et al. |
| 5,187,664 A | 2/1993 | Yardley et al. |

(Continued)

FOREIGN PATENT DOCUMENTS

| CA | 2045856 A1 | 3/1992 |
| CN | 2874799 Y | 2/2007 |

(Continued)

OTHER PUBLICATIONS

Extended European Search Report in Application No. EP 19 17 7885 dated Oct. 4, 2019; pp. 1-11; European Patent Office, 80298, Munich, Germany.

(Continued)

*Primary Examiner* — Errol V Fernandes
(74) *Attorney, Agent, or Firm* — Robert A. Blaha; Smith Tempel Blaha LLC

(57) ABSTRACT

A component carrier including i) an electronic component embedded in the component carrier, ii) an antenna structure arranged at a region of a first main surface of the component carrier, iii) a shielding structure made of an electrically conductive material and configured for shielding electromagnetic radiation from propagating between the antenna structure and the electronic component. Hereby, the shielding structure is arranged at least partially between the antenna structure and the electronic component. Furthermore, the component carrier includes an electrically conductive structure to electrically connect the electronic component and the antenna structure through the shielding structure. The shielding structure is non-perforated at least in a plane between the antenna structure and the electronic component.

19 Claims, 5 Drawing Sheets

(56) References Cited

U.S. PATENT DOCUMENTS

| | | | |
|---|---|---|---|
| 6,304,231 B1 | 10/2001 | Rajotte et al. | |
| 8,199,518 B1 * | 6/2012 | Chun | H01L 23/3128 |
| | | | 361/767 |
| 2002/0167084 A1 | 11/2002 | Coccioli | |
| 2004/0006445 A1 | 1/2004 | Paek | |
| 2004/0113848 A1 | 6/2004 | Gaucher et al. | |
| 2006/0267847 A1 | 11/2006 | Park | |
| 2007/0176843 A1 | 8/2007 | Gruber et al. | |
| 2009/0137155 A1 | 5/2009 | Peng et al. | |
| 2010/0163630 A1 | 7/2010 | Nakamura et al. | |
| 2011/0169115 A1 | 7/2011 | Lin | |
| 2011/0169698 A1 | 7/2011 | Niemi | |
| 2012/0146768 A1 | 6/2012 | Manzi et al. | |
| 2012/0293392 A1 | 11/2012 | Barrat et al. | |
| 2013/0050033 A1 | 2/2013 | Nelson et al. | |
| 2013/0135836 A1 | 5/2013 | Ridgeway et al. | |
| 2013/0207262 A1 | 8/2013 | Lachner et al. | |
| 2013/0222188 A1 | 8/2013 | Ridgeway | |
| 2013/0313692 A1 | 11/2013 | Mumbru et al. | |
| 2014/0225795 A1 | 8/2014 | Yu | |
| 2015/0070228 A1 | 3/2015 | Garcia et al. | |
| 2015/0194388 A1 | 7/2015 | Pabst et al. | |
| 2015/0364830 A1 | 12/2015 | Tong et al. | |
| 2016/0142866 A1 | 5/2016 | Song, II et al. | |
| 2016/0293557 A1 | 10/2016 | Topak et al. | |
| 2017/0033062 A1 | 2/2017 | Lin et al. | |
| 2017/0236776 A1 | 8/2017 | Huynh et al. | |
| 2018/0076526 A1 | 3/2018 | Garcia et al. | |
| 2018/0191062 A1 | 7/2018 | Ndip et al. | |
| 2018/0322739 A1 | 11/2018 | Pececnik | |
| 2019/0115646 A1 | 4/2019 | Chen et al. | |
| 2020/0052372 A1 | 2/2020 | Wang et al. | |
| 2020/0082361 A1 | 3/2020 | Ben et al. | |
| 2020/0212581 A1 | 7/2020 | Wang et al. | |
| 2020/0266532 A1 | 8/2020 | Wang | |
| 2020/0287271 A1 | 9/2020 | Lu et al. | |

FOREIGN PATENT DOCUMENTS

| | | |
|---|---|---|
| CN | 101727733 A | 6/2010 |
| CN | 101728369 A | 6/2010 |
| CN | 201497509 U | 6/2010 |
| CN | 202635816 U | 1/2013 |
| CN | 202652198 U | 1/2013 |
| CN | 203105016 U | 7/2013 |
| CN | 203340103 U | 12/2013 |
| CN | 106252877 A | 12/2016 |
| CN | 106409021 A | 2/2017 |
| CN | 106848563 A | 6/2017 |
| CN | 107134644 A | 9/2017 |
| CN | 108288423 A | 7/2018 |
| CN | 108512965 A | 9/2018 |
| CN | 108847865 A | 11/2018 |
| CN | 109459081 A | 3/2019 |
| CN | 110021821 A | 7/2019 |
| CN | 209132940 U | 7/2019 |
| CN | 209312014 U | 8/2019 |
| CN | 110994083 A | 4/2020 |
| DE | 10 2017 200 122 A1 | 7/2018 |
| EP | 1014301 A1 | 6/2000 |
| EP | 2361744 A1 | 8/2011 |
| GB | 2455305 A | 6/2009 |
| GB | 2459051 A | 10/2009 |
| IN | 5037CH2014 A | 9/2015 |
| JP | H0715225 A | 1/1995 |
| JP | 2000099673 A | 4/2000 |
| JP | 2002111368 A | 4/2002 |
| JP | 2004096302 A | 3/2004 |
| JP | 2005061671 A | 3/2005 |
| JP | 2010128934 A | 6/2010 |
| JP | 2011160414 A | 8/2011 |
| JP | 2011172025 A | 9/2011 |
| JP | 2012039596 A | 2/2012 |
| JP | 2019071548 A | 5/2019 |
| JP | 2019071643 A | 5/2019 |
| KR | 20010045624 A | 6/2001 |
| KR | 20040074559 A | 8/2004 |
| KR | 20040074578 A | 8/2004 |
| KR | 20050020069 A | 3/2005 |
| KR | 20060119004 A | 11/2006 |
| KR | 100738923 B1 | 7/2007 |
| KR | 20070071132 A | 7/2007 |
| KR | 100803348 B1 | 2/2008 |
| KR | 100811244 B1 | 3/2008 |
| KR | 20080081736 A | 9/2008 |
| KR | 100969926 B1 | 7/2010 |
| KR | 20100090574 A | 8/2010 |
| KR | 20110039955 A | 4/2011 |
| KR | 20120020692 A | 3/2012 |
| KR | 20120032417 A | 4/2012 |
| KR | 101147786 B1 | 5/2012 |
| KR | 20120057874 A | 6/2012 |
| KR | 20130013532 A | 2/2013 |
| KR | 20130043414 A | 4/2013 |
| KR | 20130092708 A | 8/2013 |
| KR | 20130106065 A | 9/2013 |
| KR | 20140038776 A | 3/2014 |
| KR | 101400846 B1 | 5/2014 |
| KR | 20160057281 A | 5/2016 |
| KR | 101651555 B1 | 8/2016 |
| KR | 101773357 B1 | 8/2017 |
| KR | 20170128673 A | 11/2017 |
| KR | 20200092615 A | 8/2020 |
| MY | 142199 A | 10/2010 |
| RU | 2013151469 A | 5/2015 |
| SG | 180028 A1 | 5/2012 |
| TW | 200849712 A | 12/2008 |
| WO | 2011105650 A1 | 9/2011 |
| WO | 2012155307 A1 | 11/2012 |
| WO | 2014161316 A1 | 10/2014 |
| WO | 2019205835 A1 | 10/2019 |
| WO | 2020073329 A1 | 4/2020 |
| WO | 2020082361 A1 | 4/2020 |
| WO | 2020133499 A1 | 7/2020 |
| WO | 2020134473 A1 | 7/2020 |
| WO | 2020134476 A1 | 7/2020 |
| WO | 2020155345 A1 | 8/2020 |
| WO | 2020200475 A1 | 10/2020 |

OTHER PUBLICATIONS

Culhaoglu, A; Communication Pursuant to Articel 94(3) EPC in Application 19 177 885.1; pp. 1-6; dated Mar. 24, 2021, European Patent Office, Postbus 5818, 2280 HV Rijswijk, Netherlands.

Zwick, T. et al.; Determination of the Complex Permittivity of Packaging Materials at Millimeter-Wave Frequencies, IEEE Transactions on Microwave Theory and Techniques, Plenum, USA, vol. 54; No. 3, Mar. 1, 2006; pp. 1001-1010, XP001524234, ISSN: 0018-9480, DOI: 10.1109/TMTT.2005.864140.

Shimizu, T. et al.; Development of a 100 GHz Grooved Circular Empty Cavity for Complex Permittivity Measurements in W Band; IEICE Transactions on Electronics, Institute of Electronics, Tokyo, Japan; vol. E94C;, No. 10; Oct. 1, 2011; pp. 1650-1656; XP001570505, ISSN: 0916-8524, DOI: 10.1587/TRANSELE.E94C.1650. [retrieved on Oct. 1, 2011].

Welcoming Mini and Max to the Google Home Family; pp. 1-5; Oct. 4, 2017; https://www.blog.google/products/home/welcoming-mini-and-max-google-home-family/; downloaded on Nov. 27, 2020.

Davis, N.; Teardown Tuesday: Google Home Mini; pp. 1-16; Nov. 4, 2017; https://www.allaboutcircuits.com/news/teardown-tuesday-google-home-mini/; downloaded on Nov. 27, 2020.

Pattnayak, T. et al.; Antenna Design and RF Layout Guidelines; Document No. 001-91445 Rev. H; Aug. 30, 2018; pp. 1-61; Cypress Semiconductor, San Jose, California, U.S.A.

PCB Design Guidelines for Reduced EMI; SZZA009; Nov. 1999; pp. 1-23; Texas Instruments Incorporated; Dallas, Texas, U.S.A.

* cited by examiner

RF FUNCTIONALITY AND ELECTROMAGNETIC RADIATION SHIELDING IN A COMPONENT CARRIER

TECHNICAL FIELD

Embodiments of the invention relate to a component carrier, an electronic device comprising the component carrier, and a method of manufacturing the component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically and magnetically reliable so as to be operable even under harsh conditions.

Common data rates provided by 4G standards may not support communication demands for future developments such as Internet of Things (IoT) and baseband applications. Therefore, upcoming 5G solutions have to provide high Gbit/s data rates to overcome losses in the so-called sub 6 Ghz and "mm-wave" range of the spectrum (i.e. between 1 GHz and 300 GHz). Future technological developments will require a constant miniaturization and improvement of signal integrity with regard to component carriers. Magnetic shielding and induction may be seen as to be very important for mm-wave developments as signal strength may become smaller.

FIG. 4 shows an example from the prior art, according to which a carrier board 400 comprises a digital integrated circuit (IC) 410 and an antenna module 420 mounted on its surface. The antenna module 420 can be equipped with a radio frequency (RF)-IC. Both entities, the IC 410 and the antenna module 420 are mounted separately from each other and are for example connected with a bonding wire. Such a system is not cost efficient and difficult to manufacture. Furthermore, these structures have high requirements with regard to the occupied space. Moreover, the antenna structure 420 and the IC 410 are performed on the same main surface (top surface). Therefore shielding of electromagnetic radiation propagating between the antenna structure 420 and the IC 410 is difficult and signal integrity is degraded.

These drawbacks hold also true for other prior art examples which use e.g. hybrid boards or two board solutions. Moreover such carrier board structures are asymmetric and thus prone to warpage. Additionally, stacked (bumped) antennas require non-copper materials for bonding the metals which will further degrade the signal integrity due to signal disturbance e.g. at Cu—Sn interfaces.

In particular, providing an antenna structure and an IC structure with respect to efficient electromagnetic radiation shielding, embedding antenna tuner or antenna IC, and miniaturization in connection with a component carrier is a challenge.

SUMMARY

There may be a need to integrate an electromagnetic radiation shielding in a component carrier with a RF functionality in a way to allow for an efficient and reliable operation.

A component carrier, an electronic device comprising the component carrier, and a method of manufacturing the component carrier according to the independent claims are provided.

According to an exemplary embodiment of the invention, a component carrier is provided, the component carrier comprising i) an electronic component embedded in the component carrier, ii) an antenna structure arranged at a region of a first main surface of the component carrier, iii) a shielding structure made of an electrically conductive material and configured for shielding electromagnetic radiation from propagating between the antenna structure and the electronic component. Hereby, the shielding structure is arranged at least partially between the antenna structure and the electronic component. Furthermore, the component carrier comprises iv) an electrically conductive structure to electrically connect the electronic component and the antenna structure through the shielding structure. The shielding structure is non-perforated at least in a plane between the antenna structure and the electronic component.

According to another exemplary embodiment of the invention, an electronic device is provided. The electronic device comprises a module with a 4G and/or a 5G functionality, and a component carrier as described above.

According to another exemplary embodiment of the invention, a method of manufacturing a component carrier is provided, wherein the method comprises i) providing a preform of a component carrier, ii) embedding an electronic component in the component carrier, iii) forming a shielding structure, made of an electrically conductive material and configured for shielding electromagnetic radiation from propagating between the antenna structure and the electronic component, iv) forming an antenna structure at least partially above the shielding structure at a region of a first main surface of the component carrier, and v) forming an electrically conductive structure to electrically connect the electronic component and the antenna structure through the shielding structure. Hereby, the shielding structure is non-perforated at least in a plane between the antenna structure and the electronic component.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board (PCB), an organic interposer, a substrate-like-PCB (SLP), and an IC (integrated circuit) substrate. A component carrier may also be a hybrid board combining different ones of the above mentioned types of component carriers.

In the context of the present application, the term "antenna structure" may particularly denote an arrangement of metallic conductor elements electrically connected for instance through a transmission line to a receiver or transmitter. Hence, an antenna structure may be denoted as an electrical member which converts electric power into radio waves, and/or vice versa. An antenna structure may be used with a controller (for instance a control chip) such as a radio transmitter and/or radio receiver. In transmission, a radio transmitter may supply an electric current oscillating at radio frequency (i.e. a high frequency alternating current) to the antenna structure's terminals, and the antenna structure may radiate the energy from the current as electromagnetic waves (in particular radio waves). In a reception mode, an antenna structure may intercept some of the power of an electromagnetic wave in order to produce a tiny voltage at its terminals, that may be applied for example to a receiver to be amplified. In embodiments, the antenna structure may be configured as a receiver antenna structure, a transmitter antenna structure, or as a transceiver (i.e. transmitter and receiver) antenna structure. In an embodiment, the antenna structure may be used for a radar application. The antenna structure may, for example, comprise a dipole antenna, a folded dipole antenna, a ring antenna, a rectangular loop antenna, a patch antenna, or a coplanar antenna. The antenna structure may also comprise a yagi antenna or a fractal antenna. A yagi antenna may be a multi-beam directional antenna for so-called mm wave applications. A fractal antenna may be another type of antenna that uses a self-similar design to maximize the length of a material in a total surface area. A fractal antenna may be compact and wideband and can act as an antenna for many different frequencies.

In the context of the present application, the term "non-perforated shielding structure" may refer to the circumstance that the shielding structure is not perforated. A perforation may be a small hole in a thin material such as a layer. The process of creating perforations may include a puncturing of a workpiece with a tool or a cutting using a laser. Furthermore, photo imageable dielectrics may be used. The process of creating a perforation may as well include depositing material only at specific regions such that at other regions, where no material has been deposited, a perforation is created. For example, a shielding structure may be created by depositing copper in order to form a copper layer. When the copper is merely deposited at specific regions, while on other regions there is no copper deposited, the other regions may be termed perforations of the shielding structure. A non-perforated shielding structure may also be denoted a continuous shielding structure, meaning that there are no holes, cavities, or perforations in said structure.

In the context of the present application, the term "plane" may denote a virtual planar area which is oriented in parallel to the two main extension directions of the shielding structure. In the case that the shielding structure is formed as a layer, the two main extension directions can be easily defined. The plane may be laterally delimited by a number of objects. For example, the plane may be laterally delimited by an antenna structure and an electronic component arranged above/below the shielding structure. As the shielding structure is at least partially arranged between the antenna structure and the electronic component, a part of the plane is also arranged between the antenna structure and the electronic component. Hereby, the borders of the plane may be defined by the borders of the antenna structure and the electronic component in a direction being perpendicular to the two main extension directions of the plane. In other words, if there is no antenna structure above and/or no electronic component below the shielding structure in said direction, than the plane is delimited at this side. Furthermore, the plane may be delimited by a first part of an electrically conductive structure. In this case, the plane is laterally delimited by the borders of the antenna structure, the electronic component, and said first structure. In the case, where there is a further first part of a further electrically conductive structure, the plane may also be delimited by the borders of said further first part. When considering the borders of the plane, the one edge of the object may be taken into consideration, which results in a larger definition of the plane. Furthermore, also the one edge of the object may be taken into consideration, which results in smaller definition of the plane. The same holds true if magnetically conductive structures are used.

In the context of the present application, the term "electrically conductive structure" may denote any structure suitable for electrically connecting an electronic component with an antenna structure. The electrically conductive structure may comprise interconnection vias and/or planar metal layers. The electrically conductive structure may comprise several parts, e.g. for connecting the electronic component with a conductive layer (e.g. a redistribution layer), or for connecting the conductive layer with the shielding layer. In this manner, at last a part of the electrically conductive structure may be oriented at a lateral side of the electronic component, thereby partially surrounding the electronic component. Like the shielding structure, the electrically conductive layer may be non-perforated. For example, a first part of the electrically conductive structure, which at least partially surrounds the electronic component, may be non-perforated.

In the context of the present application, the term "4G and/or 5G functionality" may refer to known wireless system standards. 4G (or LTE) is an established standard, while 5G is an upcoming technology which may be standardized in the near future. The electronic device may also be suitable for future developments such as 6G. The electronic device may furthermore comply with WiFi standards such as 2.4 GHz, 5 GHz, and 60 GHz. The "module" of the electronic device may for example be a so-called wireless combo (integrated with WiFi, Bluetooth, GPS . . . ), a radio frequency front end (RFFE), or a low power wide area (LPWA) network module. The electronic device may for example be a laptop, a notebook, a smartphone, a portable WiFi dongle, a smart home appliance, or a machine2machine network. The described component carrier may be integrated into the module or may be arranged separately from the module. While the described modules often comprise separate antennas, the described component carrier may be implemented to provide an electronic device, wherein the antenna structure is arranged within the module, e.g. in an embedded manner. Furthermore, the electronic device may be used for a radar application, e.g. in an industrial field (industry radar) or in the field of automotive. Hereby, the antenna structure and/or the electronic component may be configured for a radar application. In the case of automotive, there may be more electronic components (e.g. at least three) necessary depending on azimuth and desired channels.

In the context of the present application, the term "radar" may refer to an object-detection that uses electromagnetic waves to determine the range, angle, or velocity of one or more objects. A radar arrangement may comprise a transmitter transmitting electromagnetic waves (e.g. in the radio or microwave range). The electromagnetic waves from the transmitter reflect off the object and return to a receiver. Hereby, one antenna structure may be used for transmitting and receiving. Furthermore, a processor such as an electronic component may be used to determine properties of the object such as location and speed based on the received electromagnetic waves.

According to an exemplary embodiment of the invention, a component carrier with integrated antenna function and an embedded electronic component, in particular a high frequency (HF) chip (e.g. HF-CMOS, SiGe BiCMOS, GaN, GaAs, InP), is provided, in which the electronic component (e.g. a MEMS device) is efficiently shielded from electromagnetic radiation propagating from the antenna structure to the electronic component. The electrically conductive shielding structure connects the electronic component to the antenna structure. Furthermore, the electrically conductive structure is connected to the antenna structure through the shielding structure, wherein the shielding structure is non-perforated. In this manner the electrically conductive structure forms, together with the shielding structure, a non-perforated electromagnetic radiation shielding zone around the electronic component.

In this manner, a fully integrated RF functionality in a component carrier with efficient and robust shielding is provided. Because the shielding structure is non-perforated, the shielding is very efficient to ensure optimum signal integrity. Especially in the field of HF applications, e.g. for 5G modules, a high degree of signal integrity is mandatory. Furthermore, the component carrier may comprise an advantageous thermal management. The shielding structure and the electrically conductive structure can be fabricated can be made of a material with a very high thermal conductivity (e.g. copper). In this manner, the combined shielding structure/electrically conductive structure can provide an efficient heat dissipation. Thereby, not only a very efficient electromagnetic shielding is achieved but, on the same time, also a very efficient thermal management. The layer build-up of the provided component carrier can be arranged in a symmetrical manner with the antenna structure on a first main surface of the component carrier and a fan-out region (for example a redistribution layer) on a second main surface (opposed to the first main surface) of the component carrier. The component carrier is suitable for fine line structures to yield an optimum signal performance, and an integrated thermal management by using suitable materials (see below). Furthermore, the described component carrier allows for use of a single metal, e.g. copper, such that warpage can be avoided, especially in the case of a symmetric layer build-up. The described component carrier further enables minimizing manufacturing complexity and cost.

According to a further embodiment, the described component carrier may be applied in the context of radar applications. Especially a radar application with regard to the industry and/or automotive. Radar applications may be performed in a frequency range of 65 GHz and higher in the mid- or long-range—today typically from 77 GHz to 81 GHz but may increase to 90 GHz and in the long term even further as the technology capabilities will enhance. Radar applications may especially be performed in the mm-wave range for automotive (e.g. distance radar) or industrial applications (e.g. level indicator). In these examples, the antenna structure and an electronic component (e.g. a HF component for a radar application) may be advantageously arranged in spatial proximity without the occurrence of undesired parasitic effects.

In the following, further exemplary embodiments of the method and the component carrier will be explained.

In an embodiment, a first part of the electrically conductive structure at least partially surrounds the electronic component laterally. This has the advantage that a more efficient shielding can be provided, because the electronic component is also laterally shielded.

In an embodiment, the shielding structure is non-perforated at least in a plane between the antenna structure, the electronic component, and the first part of the electrically conductive structure. In this manner, an even more efficient shielding is provided, because the shielding structure forms a continuous layer reaching up to the laterally shielding first part of the electrically conductive structure.

In an embodiment, the shielding structure is formed as a layer and comprises a metal, in particular copper. This has the advantage that the shielding structure can be efficiently manufactured using a known and established process.

There are many established techniques for forming a layer structure of a metal such as copper in a component carrier. When the electrically conductive structures in a component carrier are made of the same material, e.g. copper, warpage may be avoided and manufacturing efforts are reduced.

In an embodiment, the electronic component comprises at least one terminal at a main surface region facing away from the antenna structure, wherein the terminal is connected to a second part of the electrically conductive structure which extends away from the terminal. This has the advantage that the embedded electronic component can be electrically connected to the antenna structure in a robust manner without additional devices.

Terminals for an electronic component are well known, and a large variety of terminals are suitable, as long as they are electrically connectable to the electrically conductive structure which may comprise interconnection vias and/or metal layers.

In an embodiment, the electrically conductive structure comprises a redistribution layer arranged at a second main surface of the component carrier, in particular wherein the second main surface is the side opposed to the first main surface of the component carrier. This has the advantage that a flexible fan-out region is provided, while at the same time the first part and the second part of the electrically conductive structure can be connected in an efficient and robust manner.

A redistribution layer (RDL) may be an additional layer comprising an electrically conductive material (e.g. a metal layer) on an electronic component or a component carrier that makes I/O (inside/outside) pads of an integrated circuit available to other locations. When an integrated circuit is manufactured, it usually has a set of I/O pads that are electrically connected (e.g. wire-bonded) to the pins of a package. A redistribution layer may be a layer of wiring on the chip that enables a simpler chip-to-chip, chip-to-component carrier, or component carrier-to-component carrier bonding. In an embodiment, the terminals at the component carrier side of the redistribution layer are smaller than the terminals at the component carrier opposed side of the redistribution layer. For example, the redistribution layer may comprise solder balls and/or copper pillars at the side, which is facing away from the embedded component, in order to be connectable to another entity.

In an embodiment the second part of the electrically conductive structure is arranged between and electrically connects the terminal and the redistribution layer. As the second part extends away from the embedded component and the first part laterally surrounds the electronic component, an optimum shielding is provided.

In an embodiment, the first part of the electrically conductive structure is arranged between and electrically connects the redistribution layer and the shielding structure. This has the advantage that a very efficient electrical connection is established from the electronic component to the redistribution layer, and from the redistribution layer to the shielding structure. Functional layers/structures are directly included into the electrical connections, thereby saving cost and efforts. Furthermore, in the described manner, the electrically conductive structure forms a shielding zone around the electronic component in order to optimize signal integrity.

In an embodiment, the electrically conductive structure comprises at least one interconnection via, in particular a micro-via, and at least one electrically conductive layer, in particular a planar metal layer. This has the advantage that known and established structures can be used for manufacturing the component carrier. Especially microvias for Die interconnection provide an optimum of signal integrity. Planar copper layers and through-hole vias can be used to create a shielded zone around the electronic component. In a preferred embodiment, the shielded zone is non-perforated.

A via (vertical interconnection access) is an electrical connection between layers in a physical electronic circuit that goes through the plane of one or more adjacent layers. The term via may include through-hole vias, buried vias, and blind vias. Microvias are used as interconnects between layers in high density interconnect (HDI) substrates and printed circuit boards (PCBs) to accommodate the high I/O density of advanced packages. A microvia can for example be defined by the IPC standards (2013) as a hole with an aspect ratio of 1:1, which is the ratio of the hole diameter to the depth (not to exceed 0.25 mm).

In an embodiment, the component carrier comprises at least one further electrically conductive structure with a further first part of the electrically conductive structure which at least partially surrounds the electronic component such that the electrically conductive structure and the further electrically conductive structure form an electromagnetic radiation shielding zone around the electronic component. Hereby, the shielding structure is non-perforated in a plane between the antenna structure, the electronic component, the first part of the electrically conductive structure and the further first part of the further electrically conductive structure. This has the advantage that an even more efficient shielding can be provided.

The further electrically conductive structure can for example be arranged on the opposite side of the electrically conductive structure with respect to the electronic component. A plurality of further electrically conductive structures can be arranged, for example four or more. The more of the further electrically conductive structures are applied, the denser is the shielding zone and the better may the shielding of the electronic component be. In an embodiment, using a plurality of further electrically conductive structures, the electronic component may be, at least partially, hermetically sealed. In another preferred embodiment, each of the electrically conductive structures of the shielding zone is non-perforated.

In an embodiment, the electrically conductive structure comprises an electrically conductive portion arranged at a region of the first main surface of the component carrier, wherein the electrically conductive portion is electrically connected to the antenna structure. This has the advantage that the antenna structure can be contacted in a flexible manner.

The portion can be formed as a layer, a pad, or a terminal. Many other embodiments of the portion are also possible. The portion may comprise electrically conductive material and establish a connection between the electrically conductive structure and the antenna structure. The portion and the antenna structure may be connected by wire-bonding, a conductive layer, or a conductor track. However, many other embodiments are possible.

In an embodiment, the component carrier comprises a dielectric layer arranged at the antenna structure, in particular a dielectric layer with a dissipation factor of not more than 0.0008 at 80 GHz. In another example, a dissipation factor of not more than 0.005, in particular of not more than 0.003, more particularly not more than 0.0015, at 10 GHz. According to a further example, not more than 0.00015 at 100 GHz. This has the advantage that the loss of high frequencies is reduced.

The dielectric layer comprises an electrically insulating material. In a preferred embodiment, the dielectric layer comprises a low df (dissipation factor) value and/or a low dk (relative permeability) value. The dielectric layer may be a high frequency dielectric. The term "high-frequency dielectric" may particularly denote an electrically insulating material which has low loss properties when a high-frequency or radio frequency signal propagates from or to an antenna structure in the direct environment of the high-frequency dielectric. In particular, the high-frequency dielectric may have a lower loss than standard prepreg material of a stack of component carrier material. As an example, RO3003™ material, as commercialized by the company Rogers Corporation, can be used as high-frequency dielectric. Another example are materials with a Dk smaller than 3.0 or a Df smaller than 0.001 (for example PTFE or LCP (liquid crystal polymer)). For instance, high-frequency dielectric material may have a dissipation factor of not more than 0.005, in particular of not more than 0.003, more particularly not more than 0.0015, at 10 GHz. The mentioned high frequency circuit materials may be for example ceramic-filled PTFE (polytetrafluoroethylene) composites.

In an embodiment, the shielding structure is at least partially integrated in the high-frequency dielectric. This allows combining an efficient electromagnetic radiation shielding function with a compact design. Moreover, this ensures the shielding to be carried out spatially very close to the antenna structure(s), and thus very efficiently close to the source or the destination of the radio frequency waves.

In an embodiment the electronic component is embedded in an electrically insulating material, in particular a dielectric material with a matched coefficient of thermal extension (CTE), in particular a CTE between 1 and 10 ppm, more in particular between 3 and 7 ppm. The CTE may especially be around 6 ppm in the case of gallium nitride. This has the advantage that the electronic component can be highly reliably encapsulated.

In an embodiment, the component carrier further comprising a core structure, in particular a center core structure, wherein the core structure comprises a cavity, and wherein the electronic component is arranged at least partially inside the cavity. This has the advantage that a robust component carrier with high signal integrity performance can be provided.

The core may be made of an electrically insulating material (see materials listed below). The core may also comprise the same material as the dielectric layer described above. The term "center" may in this context refer to a symmetric build-up of the component carrier with respect to the core.

In an embodiment, the horizontal layer build-up of the component carrier is symmetric with respect to the embedded electronic component, in particular to the embedded electronic component arranged in the cavity of the core structure. This has the advantage that the risk of warpage is reduced, while the manufacturing is simplified and signal integrity may be improved.

In an embodiment, the electrically conductive structure consists of one single metal, in particular copper. This has also the advantage that warpage is reduced, while the manufacturing is simplified (no different materials needed) and signal integrity is improved.

In an embodiment the electronic component is a high frequency, HF, component. This has the advantage that the electronic component may operate at very high data rates. The HF component may be a chip or a group of chips for a so-called "mm wave" application. The HF component may be one of the group consisting of HF-CMOS, SiGe, BiC-MOS, GaN, GaAs, and InP. Furthermore, the HF component may be configured for a radar application.

At least one component may be embedded in the component carrier. The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, a logic chip, a light guide, and an energy harvesting unit. However, other components may be embedded in or surface mounted on the component carrier. For example, a magnetic element can be used as a component. Such a magnetic element may be a permanent magnetic element (such as a ferromagnetic element, an antiferromagnetic element or a ferrimagnetic element, for instance a ferrite coupling structure) or may be a paramagnetic element. However, the component may also be a further component carrier, for example in a board-in-board configuration. Furthermore, the component may be a magnetic material optimized even in specific areas of the structure.

In an embodiment, a cut-out portion is arranged below the antenna structure, wherein the cut-out portion forms a cavity, and wherein the cavity is at least partially filled with gas, in particular air. This has the advantage that the cavity allows electromagnetic waves to propagate into the vicinity of the antenna structure while electrically conductive material provided on the cavity surface provides efficient electromagnetic shielding.

In an embodiment, the component carrier comprises a first component carrier part having a first cut-out portion, and the component carrier comprises a second component carrier part having a second cut-out portion. The first cut-out portion and the second cut-out portion face opposite main surfaces of the antenna structure. An electrically conductive material is provided on the surface of the first cut-out portion and on the surface of the second cut-out portion. The first cut-out portion and the second cut-out portion respectively form a first cavity and a second cavity on opposite sides of the antenna structure, and the first cavity and the second cavity are at least partially filled with gas, in particular air. This has the advantage that similar positive effects as for a suspended stripline structure (SSS) are provided, while the package is more compact without the need for an external metal housing and the cost and labor associated with mounting thereof.

The cavities are preferably filled with air of another medium suitable for propagation of electromagnetic waves. The cavities allow electromagnetic waves to propagate into the vicinity of the antenna structure while electrically conductive material provided on the cavity surface may provide efficient electromagnetic shielding.

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the method further comprises i) providing a core structure, in particular a center core structure, ii) removing material from the core structure in order to form a cavity in the core structure, and iii) placing the electric component at least partially in the cavity before the electronic component is embedded. This has the advantage that established and reliable manufacturing techniques can be applied to provide a robust and efficient component carrier.

In an embodiment, removing material includes a subtractive process and/or a modified semi-additive process (mSAP). Such a mSAP provides the advantage that straight side walls can be produced and thereby signal performance, power delivery, and thermal management can be improved.

Subtractive methods remove metal (e.g. copper) from a metal-coated component carrier to leave only a desired metal pattern. By using mSAP, a very thin metal layer (copper) may be coated onto the component carrier, and plated in the areas where resist is not applied. The thin metal, which remains in the spaces between conductive structures, is then etched away. In this manner, electrically conductive structures can be formed with much better precision, with straight vertical lines, yielding a rectangular-shaped cross-section that maximizes circuit density and enables low signal loss. Furthermore, there is a low roughness on side wall plating.

In an embodiment, forming the electrically conductive structure comprises a semi-additive process (SAP). This has the advantage that fine line structures and straight side walls, which provide a high level of signal integrity and minimize signal losses, can be efficiently produced. Furthermore, a lower roughness on track foot is possible.

The standard SAP process for obtaining conductive patterns may comprise seed layer (e.g. electroless metal) deposition and etching and/or electroplating. An unpatterned component carrier may have a thin layer of metal (e.g. copper) already on it. A reverse mask may then be applied (unlike a subtractive process mask, this mask exposes those parts of the substrate that will eventually become traces). Additional metal may then be plated onto the component carrier board in the unmasked areas. Then, metal may be plated to any desired weight. Tin-lead or other surface platings may then be applied. The mask may be stripped away and a brief etching step may remove the now-exposed bare original metal laminate from the component carrier, isolating the individual traces. Some single-sided boards which have plated-through holes may be made in this way. The (semi-)additive process may also be used for multi-layer boards as it facilitates the plating-through of the holes to produce conductive vias in a circuit board.

In an embodiment, the antenna structure is formed as at least part of a patterned one of the plurality of electrically conductive layer structures. Integrating the antenna structure in the electrically conductive part of the component carrier material renders the component carrier as a whole highly compact.

In an embodiment, the antenna structure is configured as a directional antenna structure. A directional antenna structure may be denoted as an antenna structure which radiates or receives greater power in specific directions allowing for increased performance and reduced interference from unwanted sources. Directional antennas provide increased performance over dipole antennas or omnidirectional antennas when greater concentration of radiation in a certain direction is desired. Hereby, both vertical and horizontal structures may be desired for best signal.

In an embodiment, the component carrier comprises a further antenna structure. One of the antenna structure and the further antenna structure is configured for a first function, in particular near field communication, and the other one of the antenna structure and the further antenna structure is configured for a second function, in particular wide range communication. Thus, multiple different RF functions may be integrated in a compact with in a common component carrier.

In an embodiment, the component carrier comprises multiple units. An example of one unit is e.g. shown in FIG. 2. One unit may comprise one or more antenna structures. Accordingly, said unit may also comprise a shielding structure. One unit may also comprise no antenna structure. The units may be arranged within the component carrier adjacent to each other or may be spatially separated. A component carrier may comprise a plurality of units which are arranged laterally with respect to each other. This may provide the advantage that a component carrier with multiple functionalities may be designed in a very flexible manner.

As mentioned above, the component carrier may comprise a stack of at least one electrically insulating layer structure and/or at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate-like-printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a component carrier having a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

Furthermore, the component carrier may be configured as a substrate-like-printed circuit board (SLP).

In an embodiment, the at least one electrically conductive layer structure and/or the electrically conductive structure comprises at least one of the group consisting of copper, aluminum, nickel, silver, gold, palladium, cobalt, and tungsten. Although copper is usually preferred, other materials or coated versions thereof are possible as well, in particular coated with supra-conductive material such as graphene.

In an embodiment, the electrically conductive structure, in particular the shielding structure, is at least partially coated and/or at least partially consists of a supra-conductive material. A supra-conductive material may be a material, wherein the electric resistance is not measureable, i.e. is around zero. The further electrically conductive structures may also at least partially comprise the supra-conductive material.

In an embodiment, the component carrier is a laminate-type body. In such an embodiment, the component carrier is a compound of multiple layer structures which are stacked and connected together by applying a pressing force, if desired accompanied by heat.

DETAILED DESCRIPTION OF EXEMPLARY EMBODIMENTS

Figure 1A:
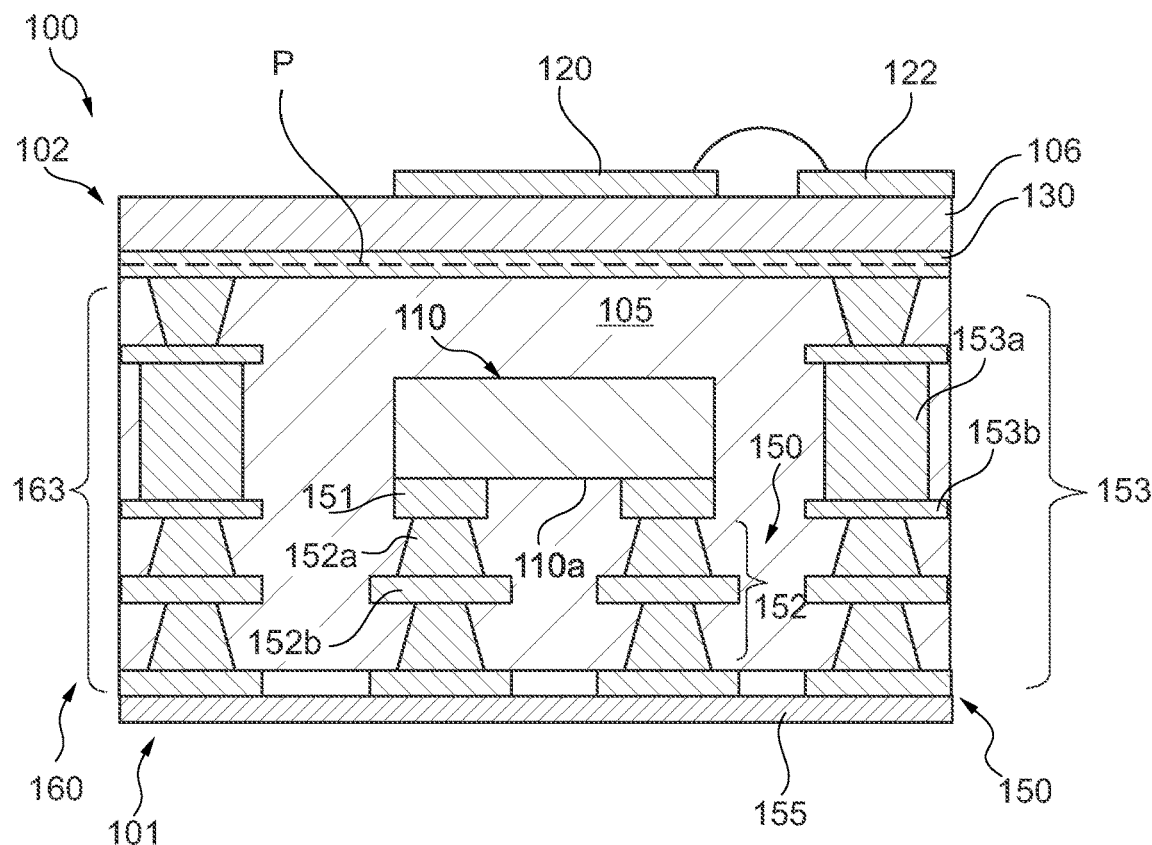
FIGS. 1A, 1B and 1C illustrate cross-sectional views, respectively, of a component carrier according to exemplary embodiments of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a component carrier with a highly reliable integrated radio frequency region is provided. More specifically, a protected, highly reliable integrated high-frequency area is foreseen in such a component carrier.

According to an exemplary embodiment, the following advantages are provided: a packaging solution for an RF chip, a fine line fan-out for best signal performance, an integrated shielding, an integrated thermal management, power supply, a connection to a digital part, an antenna function for multi beam, integrated inductor/magnetics for optimizing the performance, and Z-direction connections for connecting multi-beam elements and tuning.

According to an exemplary embodiment, a fully integrated RF-package can be provided with integrated shielding, thermal management and a symmetric build-up with an antenna on surface 1 (bottom side) and fan-out (e.g. redistribution layer) on surface 2 (top side). This allows for use of a single metal (copper) and optimum shielding of components to ensure optimum signal integrity, avoid warpage, and minimize manufacturing complexity and cost by a symmetric build-up.

Integrating a radio frequency functionality in a component carrier such as a printed circuit board (PCB) involves certain requirements in terms of dielectric materials. For instance, high-frequency materials provided by Rogers Corporation may be used which are conventionally required to be used as full layers. This involves a significant cost effort and also generates a spatially extended material bridge along a large portion of the component carrier. Conventionally, such antenna structures are arranged at an outer surface of the component carrier, which renders an antenna structure prone to failure due to mechanical damage. These and other shortcomings conventionally limit the reliability of component carriers with integrated antenna structure.

In all embodiments of the invention, it is possible to additionally provide one or more shielding vias in order to additionally protect the antenna signals. Also the integration of one or more air cavities is possible.

According to an exemplary embodiment, one or more additional shielding structures are provided for shielding the cavity, in particular an electronic component within the cavity. The cavity is formed in an electrically insulating core structure and the core structure can be at least partially surrounded by an electrically conductive material, e.g. copper. Said conductive material can therefore serve as an additional shielding structure. In another embodiment, an additional electrically conductive structure can be arranged such that a side-shielding for the cavity is provided.

Furthermore, so-called "x in board" technology can be used to integrate partially a board comprising the antenna structure into the component carrier.

X in board is a localized subcomponent carrier area using different material and/or stack up and/or Design Rules as the rest of the component carrier. It can be used to integrate different materials as well as manage pitch translation between substrates. X in board is also focused on cost optimization as it provides integration of two cost optimized material structures.

FIG. 1A illustrates an exemplary embodiment of a component carrier 100 comprising an electronic component 110 embedded in an electrically insulating material 105 of the component carrier 100. The electronic component 110 is hereby a high frequency (HF) chip. The component carrier 100 comprises a first main surface 102 and a second main surface 101 opposed to the first main surface 102. A planar antenna structure 120 is arranged at a region of the first main surface 102 of the component carrier 100. The antenna structure 120 is arranged at or embedded in a dielectric layer 106 which comprises a low Dk value and/or a low Df value. Below the dielectric layer 106 there is arranged an electromagnetic radiation shielding structure 130 which is formed as a layer and is made of an electrically conductive metal, for example copper. The shielding structure 130 is configured for shielding electromagnetic radiation from propagating between the antenna structure 120 and the electronic component 110. The shielding structure 130 is arranged in a plane between the antenna structure 120 and the electronic component 110 in order to provide a maximum shielding effect between the antenna structure 120 and the electronic component 110.

Furthermore, the component carrier 100 comprises an electrically conductive structure 150 to electrically connect the electronic component 110 and the antenna structure 120 through the shielding structure 130. The electrically conductive structure 120 comprises three main parts: a first part 153, a second part 152, and a third part, configured as a redistribution layer 155. Even though the redistribution layer 155 is shown schematically as a full layer, the person skilled in the art knows that the redistribution layer 155 can be perforated and/or separated into different parts according to respective applications. The first part of the electrically conductive structure 153 is formed by a plurality of interconnection vias 153a and planar layers 153b. Both, the vias 153a and the planar layers 153b are made of the same metal, for example copper. The first part of the electrically conductive structure 153 is oriented lateral of the electronic component 110, thereby surrounding the electronic component 110 at least partially laterally. The redistribution layer 155 is arranged at the second main surface 101 of the component carrier 100, which is opposed to the first main surface 102. The redistribution layer 155 is electrically connected to the first part of the electrically conductive structure 153. The second part of the electrically conductive structure 152 is arranged between the electronic component 110 and the redistribution layer 155. The second part of the electrically conductive structure 152 also comprises interconnection vias 152a and planar layers 152b like the first part of the electrically conductive structure 153. The electronic component 110 comprises on a main surface region 110a, facing away from the antenna structure 120, a terminal 151. The terminal 151 is connected to the second part of the electrically conductive structure 152 which extends away from the terminal 151.

In the described manner, the electrically conductive structure 150 electrically connects the electronic component 110 via the second part of the electrically conductive structure 152 to the redistribution layer 155. The electrically conductive structure 153 further connects the redistribution layer 155 via the first part of the electrically conductive structure 153 to the shielding structure 130. The shielding structure 130 is hereby non-perforated at least in a plane P (shown in dotted lines), being parallel to the shielding structure 130, between the antenna structure 120, the electronic component 110, and the first part of the electrically conductive structure 153. The shielding structure 130 is further connected to an electrically conductive portion 122 which is further connected to the antenna structure 120. The layer build-up of the component carrier 100 comprises i) the central electrically insulating material 105, wherein the electronic component 110 is embedded, ii) the electrically conductive shielding structure 130 on top of the electrically insulating material 105, and iii) the electrically conductive redistribution layer 155 below the electrically insulating material 105. Thus, the component carrier 100 is build-up in a symmetric manner. Furthermore, the component carrier 100 comprises further electrically conductive structures 160. The further electrically conductive structures 160 comprise a further first part 163 which at least partially surrounds the electronic component 110 laterally. In this manner, the electrically conductive structure 150 and the further electrically conductive structures 160 form a shielded zone around the electronic component 110 in order to shield the electronic component 110 from electromagnetic radiation from the antenna structure 120.

Figure 1B:
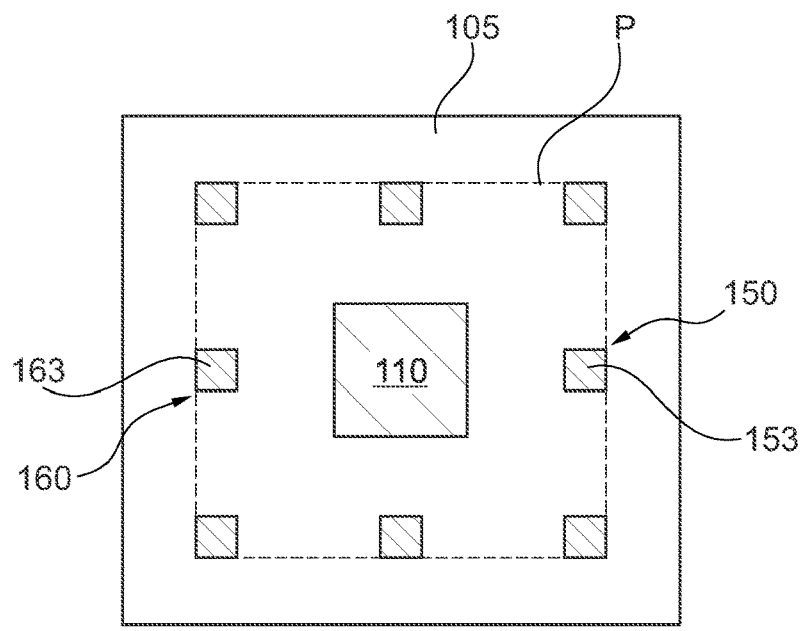

FIG. 1B illustrates a top view on a cross-section of an exemplary embodiment of the component carrier 100. The electronic component 110 is embedded in the electrically insulating material 105 of the component carrier 100. The component carrier 100 comprises a plurality of further electrically conductive structures 160. Each further electrically conductive structure 160 comprises a further first part 163 which at least partially surrounds the electronic component 110 laterally. In this manner, the electrically conductive structure 150 and the further electrically conductive structures 160 form a shielded zone around the electronic component 110 in order to shield the electronic component 110 from electromagnetic radiation from the antenna structure 120. The dimension of the plane P, in which the shielding structure is non-perforated, and which is laterally delimited by the first parts electrically conductive structures 153, 163, is shown by a dotted line.

Figure 1C:
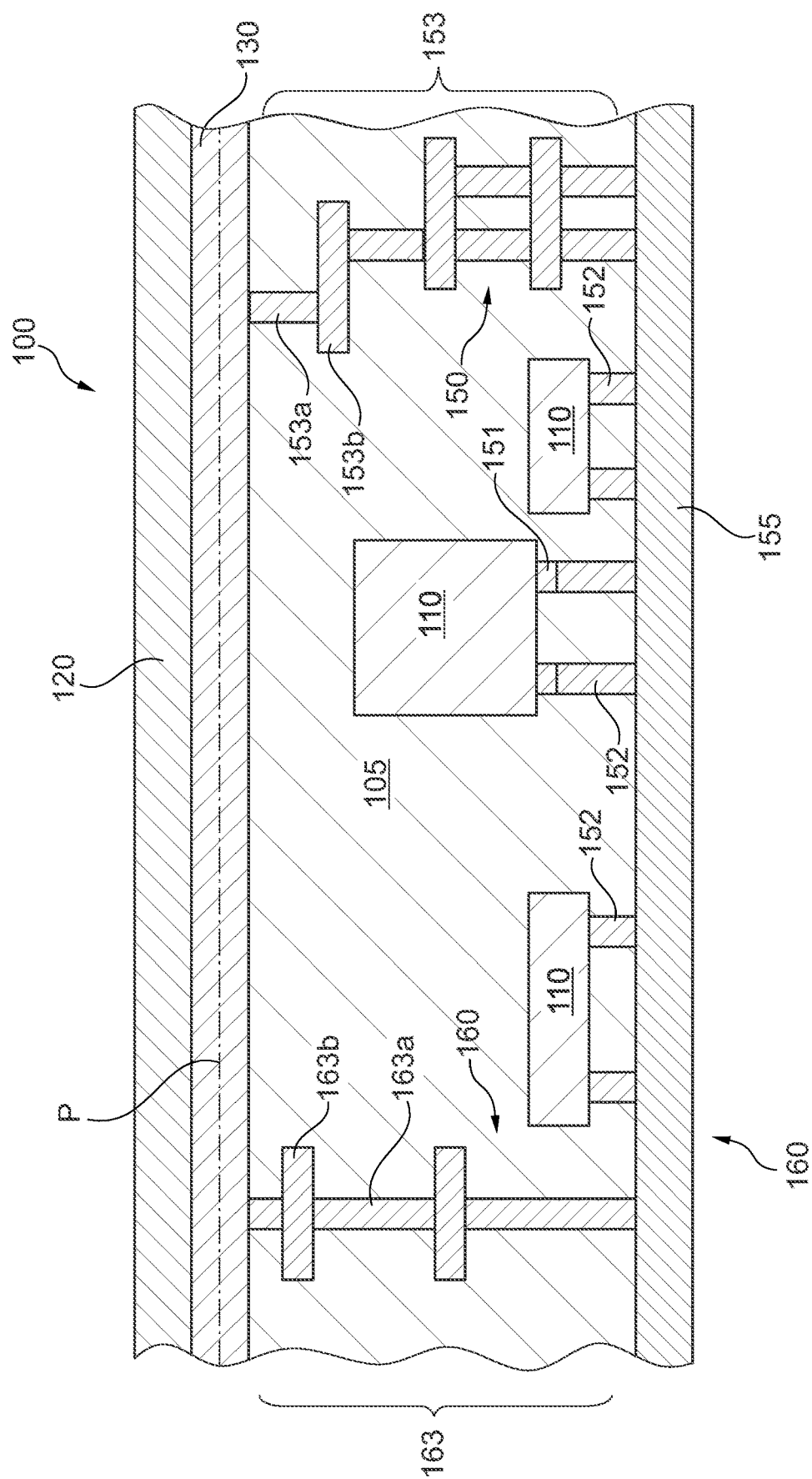

FIG. 1C illustrates a cross-sectional view of another exemplary embodiment of the component carrier 100. The component carrier 100 is very similar to the component carrier 100 of FIG. 1A with the differences that a plurality of electronic components 110 are embedded in the component carrier 100 and that the component carrier 100 comprises a further electrically conductive structure 160. The further electrically conductive structure 160 comprises a further first part 163 which at least partially surrounds the electronic components 110 laterally. In this manner, the plurality of different electronic components 110 can be arranged in one shielded zone, delimited by the shielding structure 130, the electrically conductive structure 150, and the further electrically conductive structure 160. Hereby, the shielding structure 130 and the redistribution layer 155 are shared by the electrically conductive structure 150 and the further electrically conductive structure 160. The second part 152, 162 which connect the electronic components 110 with the redistribution layer are also shared between the electrically conductive structure 150 and the further electrically conductive structure 160. Also in this embodiment, the shielding structure 130 is non-perforated in a plane P (shown by a dotted line) between the antenna structure 120, the plurality of electronic components 110, the first part of the electrically conductive structure 153 and the further first part of the further electrically conductive structure 163. The layer build-up of the component carrier 100 comprises i) the central electrically insulating material 105, wherein the electronic component 100 is embedded, ii) the electrically conductive shielding structure 130 on top of the electrically insulating material 105, and iii) the electrically conductive redistribution layer 155 below the electrically insulating material 105. Thus, the component carrier 100 is build-up in a symmetric manner.

Figure 2:
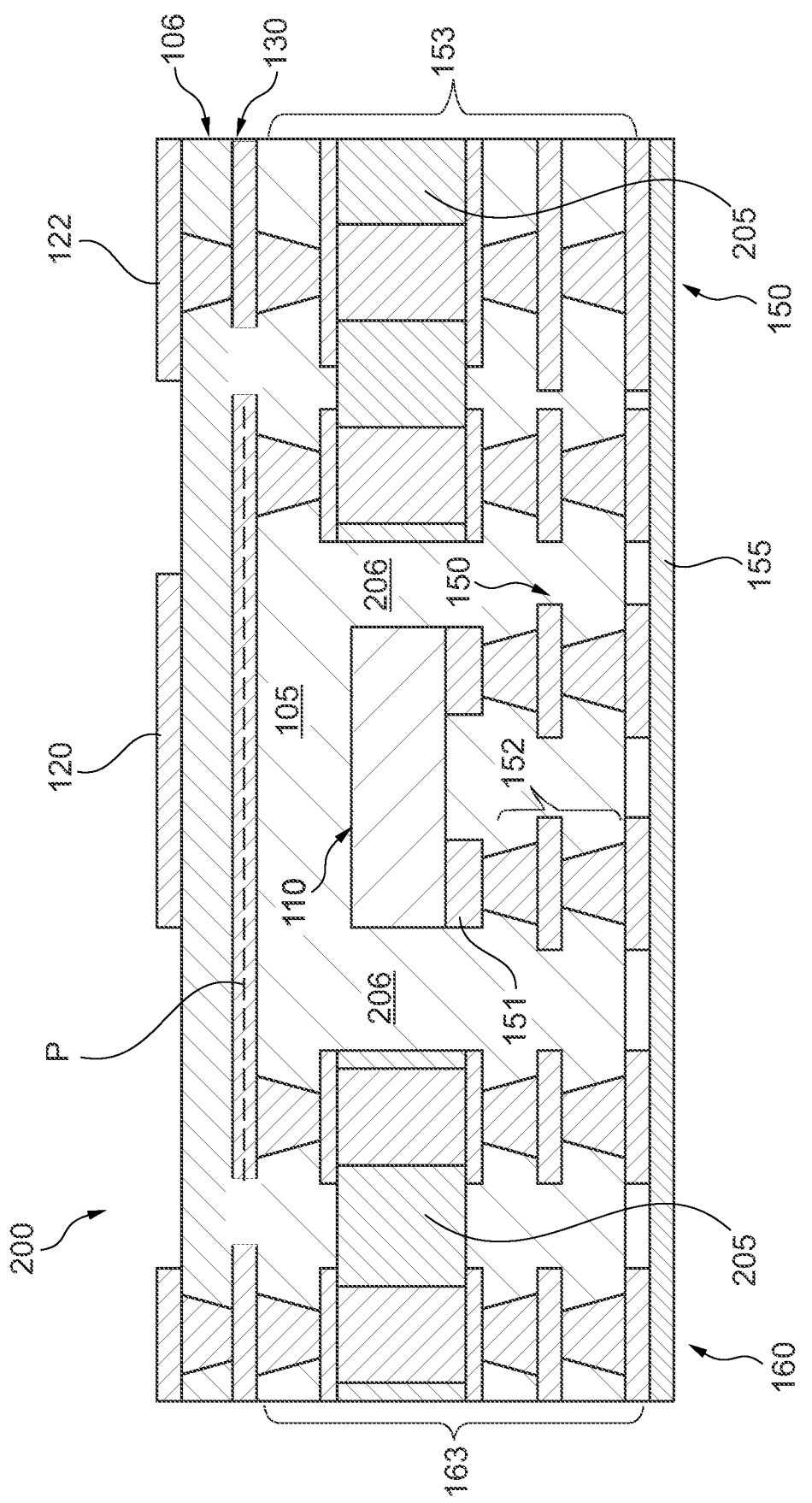
FIG. 2 illustrates a cross-sectional view of a component carrier comprising a core structure according to an exemplary embodiment of the invention.

FIG. 2 illustrates a cross-sectional view of a component carrier 200 according to an exemplary embodiment of the invention. The component carrier 200 comprises a center core structure 205 which is arranged in the center of the electrically insulating material 105. The core structure 205 comprises a cavity 206 and the electronic component 110 is arranged in the cavity 206. The core structure 205 is surrounded by an electrically conductive material. In this manner, the cavity 206, in particular the electronic component 110 within the cavity 206, is additionally shielded. The electronic component 110 is embedded in the electrically insulating material 105 and the cavity 206 between the electronic component 110 and the core structure 205 is also filled with the electrically insulating material 105. The layer build-up of the component carrier 200 comprises i) the central core structure 205 embedded in the electrically insulating material 105, ii) the electrically conductive shielding structure 130 being arranged on top of the electrically insulating material 105, and iii) the electrically conductive redistribution layer 155 being arranged below the dielectric material 105. Thus, the component carrier 200 is build-up in a symmetric manner. The shielding structure 130 is perforated in a region, which is not in a plane P between the antenna structure 120, the electronic component 110, the first part of the electrically conductive structure 153, and the further first part of the further electrically conductive structure 163.

According to an exemplary embodiment, the structure described in FIG. 2 represents one unit which can be arranged more than once within the component carrier 200. For example, the component carrier 200 comprises at least two units as described in FIG. 2 arranged laterally with respect to each other. These units can be arranged adjacent to each other or within a certain distance. Furthermore, the unit shown in FIG. 2 can be provided without an antenna structure 120. In this manner, a component carrier 200 having i) one or more units according to FIG. 2 with the antenna structure 120 and ii) one or more units according to FIG. 2 without the antenna structure 120 can be provided. Hereby, said units can be arranged laterally with respect to each other.

FIGS. 3A-3E show cross-sectional views of structures obtained during carrying out a method of manufacturing a component carrier 100 according to an exemplary embodiment of the invention.

Figure 3A:
FIGS. 3A, 3B, 3C, 3D and 3E show cross-sectional views, respectively, of structures obtained during performance of a method of manufacturing a component carrier comprising a core structure according to an exemplary embodiment of the invention.

FIG. 3A illustrates a step of providing a preform of a component carrier 100. The preform comprises a core structure 205 and an interconnection via 153a.

Figure 3B:

FIG. 3B illustrates a step of removing material from the core structure 205 in order to form a cavity 206 in the core structure 205.

Figure 3C:
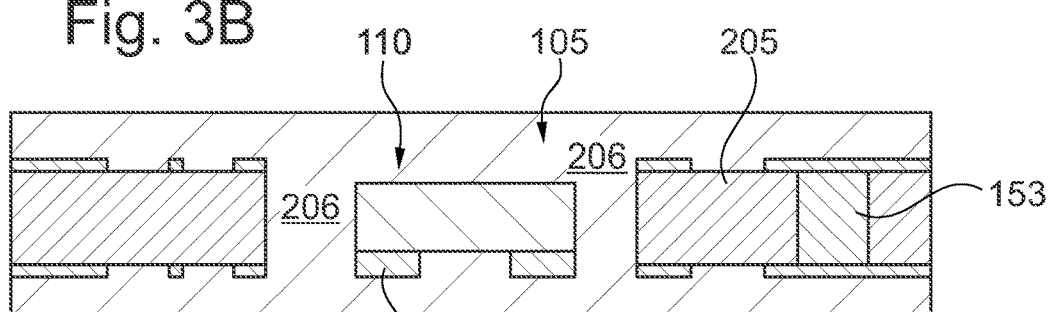

FIG. 3C illustrates a step of placing the electronic component 110 inside the cavity 206. Furthermore, FIG. 3C illustrates a step of encapsulating the electronic component 110 in a dielectric material 105.

Figure 3D:
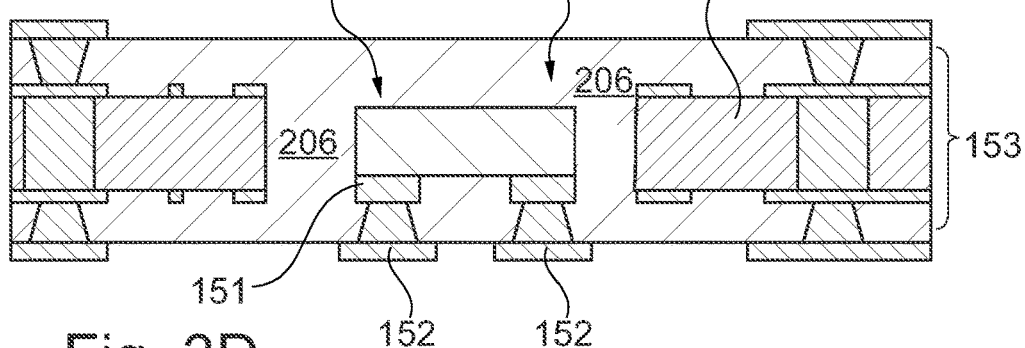

FIG. 3D illustrates a step of forming a second part of an electrically conductive structure 152 by forming electric contacts to the electronic component 110. Furthermore, the via 153a is extended in order to form a first part of an electrically conductive structure 153.

Figure 3E:
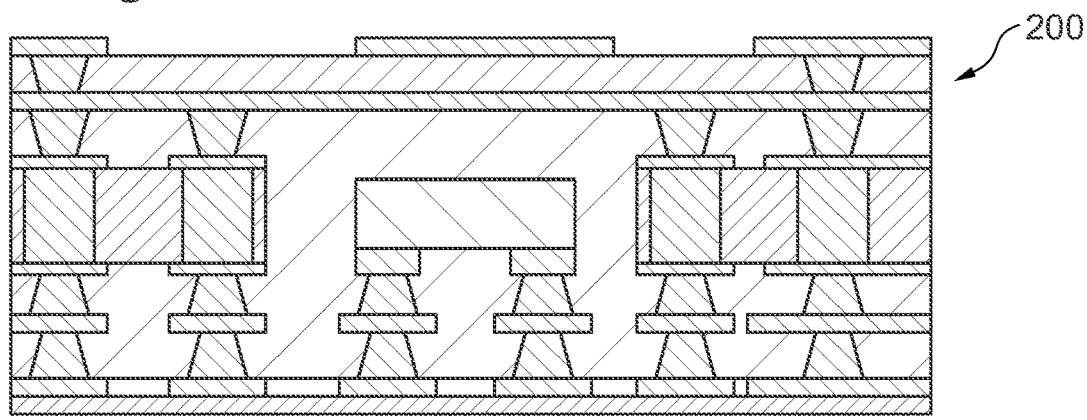
Figure 4:
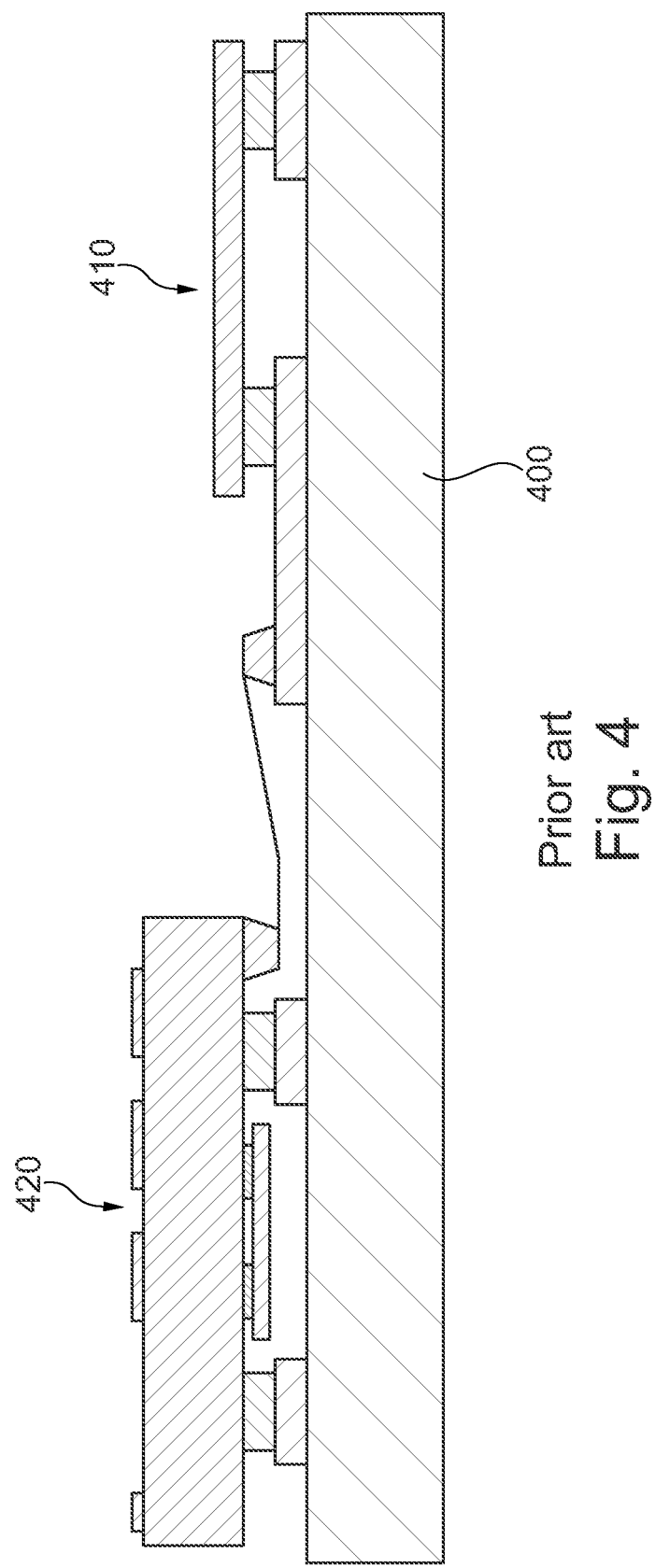
FIG. 4 illustrates an example from the prior art.

FIG. 3E illustrates a step of forming a shielding structure 130 and an antenna structure 120 to finish the component carrier 200 (see FIG. 2). It should be noticed that the electrically conductive structure 150 and the shielding structure 130 are made of the same material, in particular copper.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

REFERENCE SIGNS 100, 200 Component carrier
101 Second main surface
102 First main surface
105 Electrically insulating material
106 Dielectric layer
110 Electronic component
110a Main surface of electronic component
120 Antenna structure
122 Electrically conductive portion
130 Shielding structure
150 Electrically conductive structure
151 Terminal
152 Second part of electrically conductive structure
152a, 153a, 163a Interconnection via
152b, 153b, 163b Metal layer
153 First part of electrically conductive structure
155 Redistribution layer
160 Further electrically conductive structure
163 Further first part of electrically conductive structure
205 Core structure
206 Cavity in core structure
400 Prior art carrier board
410 Prior art digital IC
420 Prior art antenna module
P Plane

The invention claimed is:

1. A component carrier configured as one of the group consisting of a printed circuit board, a substrate-like printed circuit board, and a substrate, the component carrier, comprising:
   an electronic component embedded in the component carrier, wherein the electronic component is fully encapsulated in an electrically insulating material, wherein the electronic component is a high frequency, HF, component;
   an antenna structure arranged at a region of a first main surface of the component carrier;
   a shielding structure made of an electrically conductive material and configured for shielding electromagnetic radiation from propagating between the antenna structure and the electronic component, wherein the shielding structure is arranged at least partially between the antenna structure and the electronic component;
   a high frequency dielectric layer arranged between the antenna structure and the shielding structure; and
   an electrically conductive structure to electrically connect the electronic component and the antenna structure through the shielding structure,
   wherein the shielding structure is non-perforated at least in a plane between the antenna structure and the electronic component,
   wherein the electronic component comprises at least one terminal at a main surface region facing away from the antenna structure, and
   wherein the terminal is connected to a part of the electrically conductive structure which extends away from the terminal and the antenna structure.

2. The component carrier according to claim 1, wherein a first part of the electrically conductive structure at least partially surrounds the electronic component laterally.

3. The component carrier according to claim 2, wherein the shielding structure is non-perforated at least in a plane between the antenna structure, the electronic component, and the first part of the electrically conductive structure.

4. The component carrier according to claim 1, wherein the shielding structure is formed as a layer and comprises a metal.

5. The component carrier according to claim 1, wherein the electrically conductive structure comprises a redistribution layer arranged at a second main surface of the component carrier, the second main surface is opposed to the first main surface of the component carrier.

6. The component carrier according to claim 5, wherein the second part of the electrically conductive structure is arranged between and electrically connects the terminal and the redistribution layer.

7. The component carrier according to claim 5, wherein the first part of the electrically conductive structure is arranged between and electrically connects the redistribution layer and the shielding structure.

8. The component carrier according to claim 1, wherein the electrically conductive structure comprises at least one of an interconnection via, a micro-via, and at least one electrically conductive layer.

9. The component carrier according to claim 2, further comprising:
   at least one further electrically conductive structure comprising a further first part of the electrically conductive structure which at least partially surrounds the electronic component such that the electrically conductive structure and the further electrically conductive structure form an electromagnetic radiation shielding zone around the electronic component,
wherein the shielding structure is non-perforated in a plane between the antenna structure, the electronic component, the first part of the electrically conductive structure and the further first part of the further electrically conductive structure.

10. The component carrier according to claim 1,
wherein the electrically conductive structure comprises an electrically conductive portion arranged at a region of the first main surface of the component carrier,
wherein the electrically conductive portion is electrically connected to the antenna structure.

11. The component carrier according to claim 1,
wherein the dissipation factor of the high frequency dielectric layer is not more than 0.0008 at 80 GHz.

12. The component carrier according to claim 1,
wherein the electronic component is embedded in an electrically insulating material with a matched coefficient of thermal expansion, CTE, in a range of 1 ppm to 10 ppm.

13. The component carrier according to claim 1, further comprising:
a core structure,
wherein the core structure comprises a cavity, and
wherein the electronic component is arranged at least partially inside the cavity.

14. The component carrier according to claim 13,
wherein the horizontal layer build-up of the component carrier is symmetric with respect to the embedded electronic component in the cavity of the core structure.

15. The component carrier according to claim 1,
wherein the electrically conductive structure consists of copper.

16. The component carrier according to claim 1, further comprising at least one of the following features:
the electronic component is selected from a group consisting of an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, a magnetic element, a further component carrier and a logic chip;
a cut-out portion is arranged below the antenna structure, and the cut-out portion forms a cavity which is at least partially filled with a gas;
the component carrier comprises a first component carrier part having a first cut-out portion, and the component carrier comprises a second component carrier part having a second cut-out portion,
the first cut-out portion and the second cut-out portion face opposite main surfaces of the antenna structure,
an electrically conductive material is provided on the surface of the first cut-out portion and on the surface of the second cut-out portion,
the first cut-out portion and the second cut-out portion respectively form a first cavity and a second cavity on opposite sides of the antenna structure, and
the first cavity and the second cavity are at least partially filled with gas;
at least one of the dielectric structures comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
the electrically conductive structure is at least partially coated with and/or at least partially consists of a supra-conductive material.

17. An electronic device, comprising:
a module with a 4G and/or 5G functionality;
a component carrier, wherein the component carrier is configured as one of the group consisting of a printed circuit board, a substrate-like printed circuit board, and a substrate, with an electronic component embedded in the component carrier, wherein the electronic component is fully encapsulated in an electrically insulating material, wherein the electronic component is a high frequency, HF, component;
an antenna structure arranged at a region of a first main surface of the component carrier;
a shielding structure made of an electrically conductive material and configured for shielding electromagnetic radiation from propagating between the antenna structure and the electronic component,
wherein the shielding structure is arranged at least partially between the antenna structure and the electronic component;
a high frequency dielectric layer arranged between the antenna structure and the shielding structure; and
an electrically conductive structure to electrically connect the electronic component and the antenna structure through the shielding structure,
wherein the shielding structure is non-perforated at least in a plane between the antenna structure and the electronic component,
wherein the electronic component comprises at least one terminal at a main surface region facing away from the antenna structure, and
wherein the terminal is connected to a part of the electrically conductive structure which extends away from the terminal and the antenna structure.

18. A method of manufacturing a component carrier configured as one of the group consisting of a printed circuit board, a substrate-like printed circuit board, and a substrate, the method comprising:
providing a preform of a component carrier;
embedding an electronic component in the component carrier, such that the electronic component is fully encapsulated in an electrically insulating material, the electronic component configured to operate at one or more frequencies above 1 GHz;
forming a shielding structure which is made of an electrically conductive material and is configured for shielding electromagnetic radiation from propagating between the antenna structure and the electronic component;
forming an antenna structure at least partially above the shielding structure at a region of a first main surface of the component carrier;

introducing a dielectric layer between the antenna structure and the shielding structure, the dielectric layer having a dissipation factor of not more than 0.005; and forming an electrically conductive structure to electrically connect the electronic component and the antenna structure through the shielding structure, wherein the shielding structure is non-perforated at least in a plane between the antenna structure and the electronic component, wherein the electronic component comprises at least one terminal at a main surface region facing away from the antenna structure, and wherein the terminal is connected to a part of the electrically conductive structure which extends away from the terminal and the antenna structure.

19. The method according to claim 18, further comprising:

providing a core structure;

removing material from the core structure to form a cavity in the core structure, wherein removing material includes a subtractive process and/or a modified semi-additive process; and placing the electric component at least partially in the cavity before the electronic component is embedded in a dielectric material with a matched coefficient of thermal expansion between 1 and 10 ppm;

wherein forming the electrically conductive structure comprises a semi-additive process.

* * * * *